United States Patent
Lo et al.

(10) Patent No.: US 7,958,409 B2
(45) Date of Patent: Jun. 7, 2011

(54) METHOD FOR RECORDING MEMORY PARAMETER AND METHOD FOR OPTIMIZING MEMORY

(75) Inventors: Nan-Kun Lo, Taipei (TW); Chiy-Ferng Perng, Taipei (TW)

(73) Assignee: ASUSTeK Computer Inc., Taipei (TW)

( * ) Notice: Subject to any disclaimer, the term of this patent is extended or adjusted under 35 U.S.C. 154(b) by 283 days.

(21) Appl. No.: 12/211,040

(22) Filed: Sep. 15, 2008

(65) Prior Publication Data

US 2009/0077436 A1 Mar. 19, 2009

(30) Foreign Application Priority Data

Sep. 17, 2007 (TW) .............................. 96134695 A

(51) Int. Cl.
- G11C 29/00 (2006.01)
- G06F 11/00 (2006.01)
- G06F 9/00 (2006.01)
- G06F 13/00 (2006.01)

(52) U.S. Cl. ......... 714/718; 714/2; 714/36; 714/E11.14; 713/2; 711/103; 711/105

(58) Field of Classification Search .................. 714/718, 714/2, 36, E11.15; 713/2; 711/103, 105
See application file for complete search history.

(56) References Cited

U.S. PATENT DOCUMENTS

| | | | | |
|---|---|---|---|---|
| 5,822,581 A * | 10/1998 | Christeson | ........................ | 713/1 |
| 6,353,885 B1 * | 3/2002 | Herzi et al. | ........................ | 713/1 |
| 6,718,464 B2 * | 4/2004 | Cromer et al. | ..................... | 713/2 |
| 7,039,799 B2 * | 5/2006 | Smith et al. | ..................... | 713/100 |
| 7,234,054 B2 * | 6/2007 | Rothman et al. | .................. | 713/2 |
| 7,478,290 B2 * | 1/2009 | Co et al. | ......................... | 714/718 |
| 7,480,792 B2 * | 1/2009 | Janzen et al. | ..................... | 713/1 |
| 7,627,730 B1 * | 12/2009 | Moll | ............................. | 711/170 |
| 7,694,122 B2 * | 4/2010 | Lee | ................................... | 713/2 |
| 7,698,546 B2 * | 4/2010 | Stemen | .............................. | 713/2 |
| 7,725,701 B2 * | 5/2010 | Rios et al. | ......................... | 713/1 |
| 2003/0061531 A1 | 3/2003 | Fletcher et al. | | |
| 2005/0039081 A1 * | 2/2005 | Chang et al. | .................... | 714/36 |

(Continued)

FOREIGN PATENT DOCUMENTS

CN 1959638 5/2007

OTHER PUBLICATIONS

Article titled "Advanced Chipset Features", adopted from the chapter 4 of Full Illustration on BIOS: Complete Strategies on Configuration, Revision, Upgrade, and Enhancement, pp. 26-30., with English abstract.

(Continued)

*Primary Examiner* — John J Tabone, Jr.
(74) *Attorney, Agent, or Firm* — Jianq Chyun IP Office

(57) ABSTRACT

The invention relates to a method for recording a memory parameter and a method for optimizing a memory. In the invention, adjusted enhancement parameter data can be stored in a non-volatile memory of a memory module. Then, the setting value of a parameter of a memory module is portable, and users can write the needed setting value of the memory parameter into the non-volatile memory of the memory module. In other words, in the invention, no matter whether the memory module is applied to the same computer or not, the enhancement parameter data can be applied to prevent the users from repeatedly setting the memory parameter of the memory module in different computers.

18 Claims, 2 Drawing Sheets

U.S. PATENT DOCUMENTS

2006/0020844 A1* 1/2006 Gibbons et al. .................. 714/2
2006/0123222 A1* 6/2006 Janzen et al. .................... 713/1
2006/0206673 A1* 9/2006 Lu et al. ........................ 711/154
2006/0206764 A1* 9/2006 Lu et al. ......................... 714/36
2008/0072029 A1* 3/2008 Yu et al. ......................... 713/1
2008/0109595 A1* 5/2008 Rajan et al. .................. 711/105
2010/0142251 A1* 6/2010 Janzen et al. .................. 365/63
2010/0146199 A1* 6/2010 Shaeffer et al. .............. 711/105

OTHER PUBLICATIONS

"1st Office Action of China counterpart application", issued on Mar. 1, 2010, p. 1-p. 7.

Article titled "NVIDIA Unveils a New Open Standard Memory Specification Designed to Provide Higher Levels of System Performance" authored by Bryan Del Rizzo, NVIDIA Corporation, http://www.nvidia.com/object/IO_31187.html.

* cited by examiner

METHOD FOR RECORDING MEMORY PARAMETER AND METHOD FOR OPTIMIZING MEMORY

CROSS-REFERENCE TO RELATED APPLICATION

This application claims the priority benefit of Taiwan application serial no. 96134695, filed on Sep. 17, 2007. The entirety of the above-mentioned patent application is hereby incorporated by reference herein and made a part of this specification.

BACKGROUND OF THE INVENTION

1. Field of the Invention

The invention relates to a method for operating a memory and, more particularly, to a method for adjusting an operation parameter of a memory.

2. Description of the Related Art

Along with the continuous development of the computer industry, the performance of a computer becomes better and better. However, many users still hope that hardware devices can have greater performance to allow the global performance of the computer to be better after the users change operation parameters of the hardware devices that the users have. For example, the user often enhances the performance of the computer via an overclock method. The overclock is that operation frequencies of the hardware devices (including a central processing unit, a memory, a graphics card and so on) in the computer are higher than their predetermined operation frequencies. For example, if the original operation frequency of a memory is 800 MHz, an external processing method is used to force the memory to operate under 1000 MHz, which is the so-called overclock. Different memory modules may have different overclock capability or different best memory parameters.

As for changing the memory parameters, most memory modules only have a group of setting values of the memory parameters. Therefore, when the user wants to change the setting values set in the memory controller, he mostly needs to use an external program or a basic input output system (BIOS). Generally speaking, the memory module has four main parameters such as the column address strobe (CAS) latency (tCL), the row address strobe (RAS) precharge time (tRP), the RAS-to-CAS delay (tRCD) and the RAS activate to precharge time (tRAS), and other parameters of the memory module also can be changed. The stability and performance of the system always are affected every time the setting value of the memory is changed, and therefore, the user needs to test the memory module to confirm the usability of the setting value of the memory.

When the user confirms that the memory module can normally operate with the preferred setting value of a memory parameter, if the user wants to use the memory module in another computer, he needs to record the setting value of the set memory parameter by himself first and then resets the memory parameter according to the recorded setting value on the other computer. The reason is that when the other computer boots, it does not have the setting value of the parameter that is originally set by the user, and therefore, the computer can only set the memory controller according to standard setting values in an electrically erasable programmable read only memory (EEPROM) of the memory module. Therefore, in the conventional technology, if the user wants to make the memory module have better performance, he needs to manually set the memory parameter. Further, after the user sets the memory parameter, if he wants to use the memory module in other computers, he needs to reset the memory parameter to allow the memory module to have better performance.

BRIEF SUMMARY OF THE INVENTION

The invention provides a method for recording a memory parameter to allow the setting value of a parameter of a memory module to be portable and allow a user to write a needed memory setting value into the memory module.

The invention further provides a method for optimizing a memory to allow a memory module to utilize enhancement parameter data originally defined by a user in different computers.

The invention provides a method for recording a memory parameter for a memory module. The memory module has a non-volatile memory. The method includes the steps of booting a computer system, changing parameter data of the memory module as enhancement parameter data, testing the memory module according to the enhancement parameter data and writing the enhancement parameter data into an undefined memory block of the non-volatile memory when the memory module is tested to be stable.

In one embodiment of the invention, the step of changing the parameter data of the memory module includes the steps of changing the parameter data via a basic input output system (BIOS) set-up menu and writing the changed parameter data to a memory controller.

In one embodiment of the invention, after the step of changing the parameter data via the BIOS set-up menu, the method further includes the steps of storing the parameter data changed at the BIOS set-up menu and rebooting the computer system.

In one embodiment of the invention, when the memory module is tested to be stable, the step of writing the enhancement parameter data to the undefined memory block of the non-volatile memory includes the steps of reading the parameter data in the memory controller and writing the parameter data read from the memory controller to the undefined memory block of the non-volatile memory.

In one embodiment of the invention, the method further includes the step of providing a portable memory parameter table in the undefined memory block of the non-volatile memory. The step of writing the parameter data read from the memory controller to the undefined memory block of the non-volatile memory includes the steps of converting the parameter data read from the memory controller to have a format conforming to the format of the portable memory parameter table and writing the parameter data having the format conforming to the format of the portable memory parameter table into the portable memory parameter table of the undefined memory block of the non-volatile memory.

In one embodiment of the invention, the non-volatile memory is an electrically erasable programmable read only memory (EEPROM), and serial presence detect (SPD) data are stored in the EEPROM. The parameter data include the operation frequency, the column address strobe (CAS) latency, the row address strobe (RAS) precharge time, the RAS-to-CAS delay and the RAS activate to precharge time of the memory module. The memory module is a dynamic random access memory (DRAM).

The invention further provides a method for optimizing a memory for a memory module having a non-volatile memory. The method includes the steps of changing parameter data of the memory module to allow an undefined memory block in the non-volatile memory of the memory module to have enhancement parameter data, booting a computer system, reading data in the non-volatile memory, determining whether the enhancement parameter data are stored in the undefined memory block in the non-volatile memory and writing the enhancement parameter data into a memory controller when the enhancement parameter data are stored in the undefined memory block.

In one embodiment of the invention, standard parameter data are stored in a defined memory block in the non-volatile memory, and the method further includes the step of storing the standard parameter data after the step of reading the data in the non-volatile memory. In one embodiment of the invention, the method for optimizing the memory further includes the step of providing a specific option in a basic input output system (BIOS), and the setting value of the specific option is used to record whether the enhancement parameter data are utilized.

In one embodiment of the invention, when the enhancement parameter data are stored in the undefined memory block, the method includes the step of determining whether to utilize the enhancement parameter data according to the setting value of the specific option. The enhancement parameter data are written into the memory controller when the enhancement parameter data are utilized. The standard parameter data are written into the memory controller when the enhancement parameter data are not utilized.

In one embodiment of the invention, the method further includes the step of providing a portable memory parameter table in the undefined memory block of the non-volatile memory. The portable memory parameter table stores a plurality of groups of portable parameter data. The step of determining whether the enhancement parameter data are stored in the undefined memory block in the non-volatile memory includes the step of determining whether the non-volatile memory stores the portable memory parameter table. In one embodiment of the invention, the method for optimizing the memory further includes the step of choosing a group of portable parameter data from the portable parameter data as the enhancement parameter data.

In one embodiment of the invention, the non-volatile memory is an electrically erasable programmable read only memory (EEPROM), and serial presence detect (SPD) data are stored in the EEPROM. In one embodiment of the invention, the parameter data include the operation frequency, the column address strobe latency, the RAS-to-CAS delay, the RAS precharge time and the RAS activate to precharge time of the memory module. The memory module is a dynamic random access memory (DRAM).

In the invention, the adjusted enhancement parameter data are stored into the non-volatile memory of the memory module, and therefore, the setting value of the parameter of the memory module is portable, and the user is allowed to write the needed setting value of the memory into the non-volatile memory of the memory module. In other words, in the invention, the same memory module can utilize the enhancement parameter data originally defined by a user when it is used in different computers, and therefore, the user does not need to repeatedly set the memory parameter when the memory module is used in different computers. These and other features, aspects, and advantages of the present invention will become better understood with regard to the following description, appended claims, and accompanying drawings.

DETAILED DESCRIPTION OF THE EMBODIMENTS

As for the conventional computer technology, a user-defined setting value of a memory parameter is stored in a motherboard, and therefore, when a memory is removed to be used in another computer, the memory cannot use the memory parameter originally set by a user directly. The invention provides a method for recording a memory parameter, and the method is used to record the setting value of a parameter of a memory module and allow the setting value of the parameter of the memory module to be portable. Then, when the memory module is removed to be used in another computer, it can continue to use the setting value originally set by the user.

To conveniently illustrate the embodiment, assumptions are made hereinbelow. The method for recording a memory parameter of the embodiment is assumed to be applied to a computer system, the memory module of the embodiment is assumed to be a dynamic random access memory (DRAM), and the method for recording the memory parameter of the embodiment is assumed to be implemented with a basic input output system (BIOS). However, persons having ordinary skill in the art should know that the above assumptions are not used to limit the scope of the invention.

Figure 1:
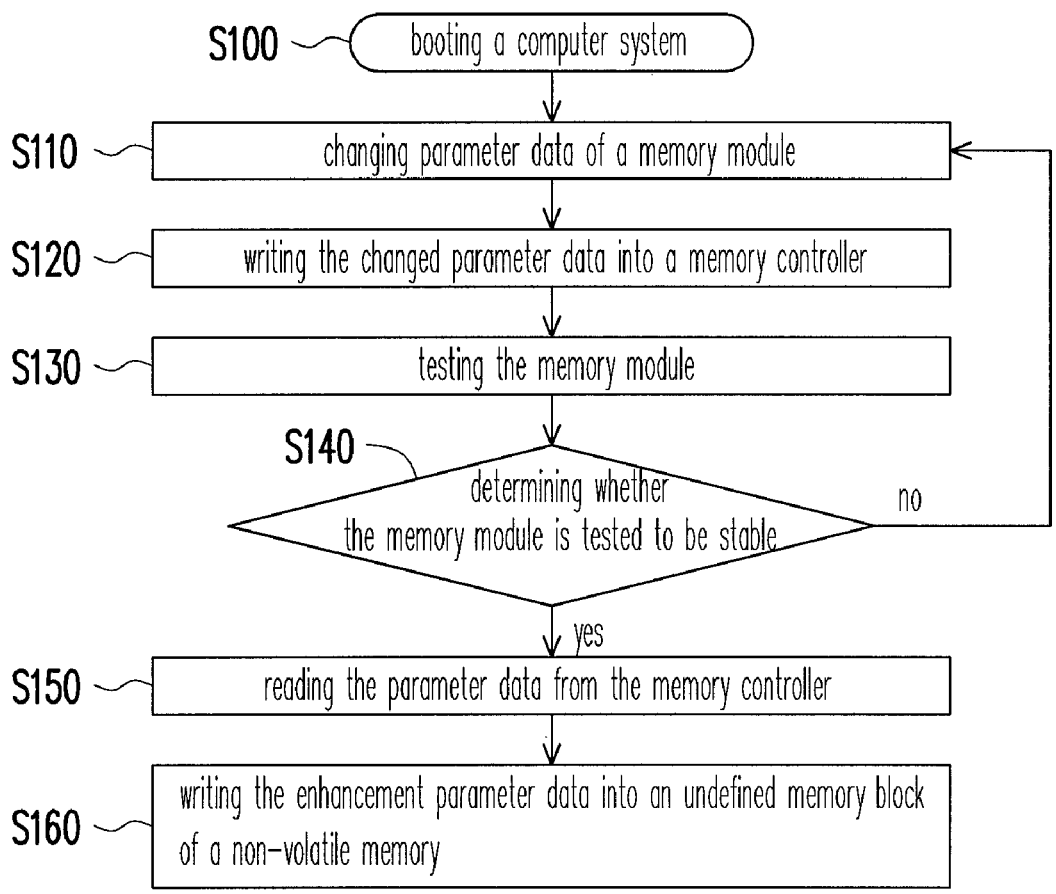
FIG. 1 is a flow chart showing a method for recording a memory parameter of an embodiment of the invention.

FIG. 1 is a flow chart showing a method for recording a memory parameter of an embodiment of the invention. As shown in FIG. 1, first, a computer system is booted (the step S100). Next, the computer system enters a BIOS set-up menu and changes parameter data of the memory module via the BIOS set-up menu (the step S110). Taking a conventional computer as an example, after a user boots the computer, he should press a hot key in a keyboard to allow the computer system to enter the BIOS set-up menu. In the BIOS set-up menu, the user can change the setting option of the BIOS according to a needed setting value of the memory parameter. After the setting option of the BIOS is changed, the BIOS stores the setting value of the changed setting option into a complementary metal oxide semiconductor (CMOS) memory or a flash memory in a motherboard, and then the computer system reboots. In the embodiment, the parameter data may include the operation frequency, the column address strobe latency, the RAS-to-CAS delay, the RAS precharge time and the RAS activate to precharge time of the memory module. In the embodiment, the number and type of the memory parameter are not limited.

Afterwards, the changed parameter data are written into a memory controller in the computer system (the step S120). At that moment, after the parameter data of the memory are changed, the computer system may be caused to be incapable of booting, or although the computer system can boot, the memory module cannot normally operate when it uses the new parameter data, thereby causing the computer system to be unstable. Therefore, after the step S120, the memory controller controls the memory module with the new parameter data and tests the memory module (the step S130). In the embodiment, the method for testing the memory module may be that the computer system executes a memory test program to determine whether the new parameter data can allow the computer system to normally operate under a disk operating system (DOS) or a window operating system.

Afterwards, whether the memory module in the computer system can stably operate with the changed parameter data is determined (the step S140). If no, the method returns to the step S110 to reset the parameter data of the memory module. Finally, if the memory module is tested to be stable, that is, the memory module can stably operate with the new parameter data, the parameter data are read from the memory controller (the step S150). The read parameter data are used as enhancement parameter data and written into an undefined memory block of a non-volatile memory in the memory module (the step S160).

Taking a conventional memory module as an example, it has a non-volatile memory block such as the memory block of a non-volatile memory chip besides a plurality of memory chips. The non-volatile memory chip is an electrically erasable programmable read only memory (EEPROM). The EEPROM stores serial presence detect (SPD) data. The EEPROM in the conventional memory module has a capacity of 256 bytes, and the internal space configuration of the EEPROM conforms to a standard defined by the Joint Electron Device Engineering Council (JEDEC). According to the standard defined by the JEDEC, the 0~98 bytes of the EEPROM are used to store standard memory parameters and the information of the supplier of the memory module. The 99~127 bytes of the EEPROM are provided for the supplier of the memory module to use. The 128~255 bytes of the EEPROM form an undefined memory block that can be used by anyone.

In the step S160 of the embodiment, the undefined memory block of the EEPROM is used to store the enhancement parameter data after the memory module is tested to be stable. When the computer system boots next time, it only needs to read the EEPROM, and then it can continue to use the enhancement parameter data. When the user removes the memory module to be used in other computer, he does not need to re-adjust the parameter data of the memory module. As long as the new computer reads the EEPROM in the memory module, it can obtain the enhancement parameter data. Thus, the new computer can use the memory module with the read parameter data, and the memory module can have preferred performance.

In the embodiment, the parameter data of the memory module may be changed via, for example, the BIOS set-up menu. Persons having ordinary skill in the art should know that other external program of the computer system also can be used to change the parameter data of the memory module in the embodiment. Furthermore, in the embodiment, a portable memory parameter table may be programmed in the undefined memory block of the EEPROM and has memory space for storing a plurality of groups of portable parameter data. In the step S160, the parameter data read from the memory controller are converted to have a format conforming to the format of the portable memory parameter table first, and then the converted parameter data are written into the portable memory parameter table in the undefined memory block of the EEPROM to allow the changed parameter data to be one group of portable parameter data in the portable memory parameter table.

To make the persons having ordinary skill in the art better understand the embodiment of the invention, a method for optimizing a memory is provided in the embodiment. To conveniently illustrate the embodiment, the application environment of the embodiment is assumed to be the same with that of the above embodiment, the memory module is assumed to be have a non-volatile memory which is an EEPROM, and enhancement parameter data are assumed to be written into the undefined memory block of the EEPROM in the memory module via the method for recording the memory parameter. The persons having ordinary skill in the art should know that the above assumptions are not used to limit the scope of the invention.

Figure 2:
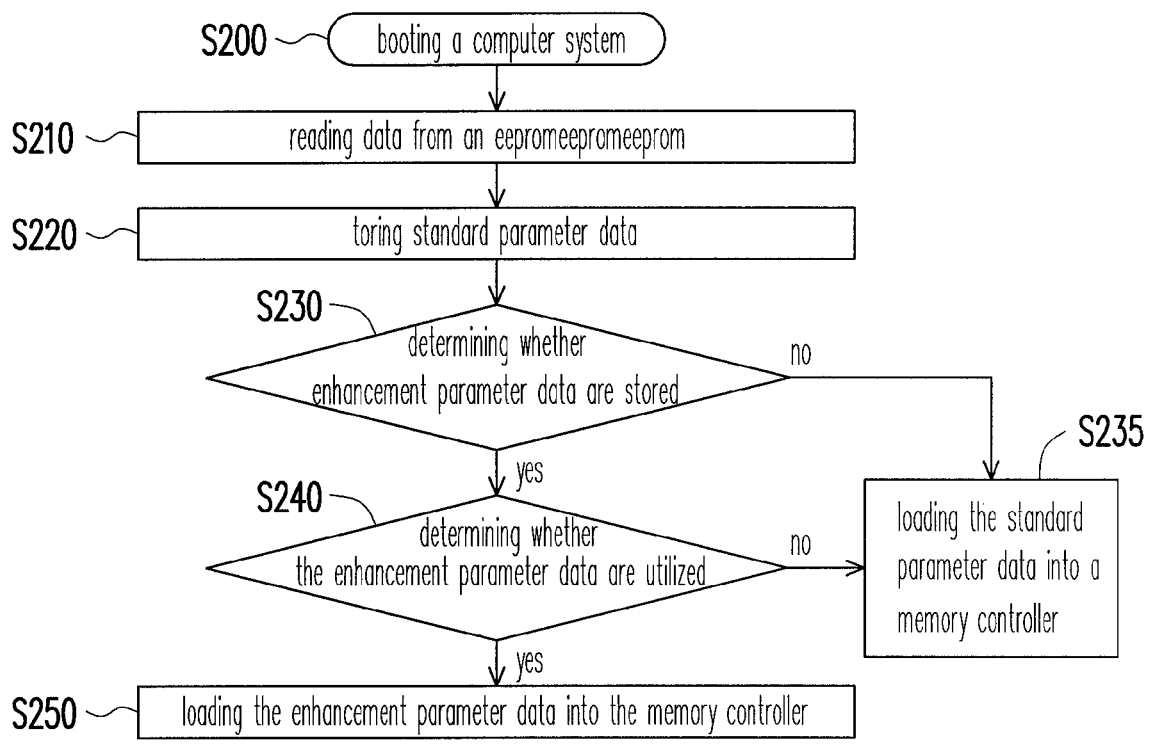
FIG. 2 is a flow chart showing a method for optimizing a memory of an embodiment of the invention.

FIG. 2 is a flow chart showing a method for optimizing a memory of an embodiment of the invention. As shown in FIG. 2, a computer system is booted (the step S200). Taking a conventional computer system as an example, the BIOS in the computer system initializes hardware devices on a motherboard first and detects the number of memory modules on the motherboard at the same time. To illustrate the embodiment, only one memory module is assumed to be disposed on the motherboard of the computer system. Afterwards, the BIOS in the computer system reads data from the EEPROM (the step S210). As for a conventional memory module, the defined memory block (such as the 0~98 bytes defined by the JEDEC) of the EEPROM stores standard parameter data provided by the memory supplier. When the memory module is used in a computer for the first time, the computer uses the standard parameter data as the parameter data of the memory module to operate the memory module.

After the BIOS reads the data from the EEPROM, it stores the standard parameter data first (the step S220). Next, the BIOS determines whether the undefined memory block of the EEPROM stores enhancement parameter data (the step S230). If the undefined memory block does not store the enhancement parameter data, the standard parameter data are loaded into the memory controller (the step S235). In other words, the computer uses the standard parameter data directly. On the contrary, if the undefined memory block stores the enhancement parameter data, the BIOS continues to determine whether the enhancement parameter data are intended to be used (the step S240). In the embodiment, the BIOS set-up menu may provide a specific option that allows the user to adjust the setting value of the specific option further to determine whether the enhancement parameter data are intended to be used. Therefore, in the step S240, the BIOS can utilize the setting value of the specific option to determine whether the enhancement parameter data are intended to be used.

In the step S240, if the enhancement parameter data are not used, the method returns to the step S235 in which the standard parameter data are loaded into the memory controller. On the contrary, if the enhancement parameter data are used, the enhancement parameter data replace the standard parameter data stored by the BIOS and are loaded into the memory controller (the step S250), and then the memory controller controls the memory module according to the enhancement parameter data.

In the embodiment, the EEPROM in the memory module also may store a portable memory parameter table having a plurality of groups of portable parameter data, and the user can choose one group of portable parameter data as the enhancement parameter data via the BIOS set-up menu. Furthermore, in the step S230, whether the EEPROM in the memory module stores the portable memory parameter table also may be determined. The portable parameter data in the portable memory parameter table may be provided by the memory supplier or obtained by the method for recording the memory parameter in the above embodiment.

In the embodiment, although the motherboard is assumed to have only one memory module, the persons having ordinary skill in the art should know that if the motherboard is provided with more than one memory modules, the computer system sets the parameter data for each memory module, calculates setting values that are the best for each memory module in the memory controller and then loads the best setting values into the memory controller. The memory controller adjusts voltages of the memory modules according to the best setting values to maintain the stability of the system.

To sum up, in the invention, the adjusted enhancement parameter data are stored into the non-volatile memory in the memory module, and therefore, the setting value of the parameter of the memory module is portable, and the user also can write the needed setting value of the memory into the non-volatile memory in the memory module. In other words, via the invention, when the same memory module is utilized in different computers, it can use the enhancement parameter data that are pre-defined by the user, and the user does not need to repeatedly set the memory parameter in the different computers. Furthermore, in the invention, a portable memory parameter table may be built in the non-volatile memory in the memory module. The portable memory parameter table can store a plurality of groups of parameter data, and then the user can randomly set a plurality of groups of parameter data in the portable memory parameter table. When the user makes the memory module used in different computers, he can choose one group of parameter data from a plurality of groups of parameter data as the parameter data of the memory.

Although the present invention has been described in considerable detail with reference to certain preferred embodiments thereof, the disclosure is not for limiting the scope of the invention. Persons having ordinary skill in the art may make various modifications and changes without departing from the scope and spirit of the invention. Therefore, the scope of the appended claims should not be limited to the description of the preferred embodiments described above.

What is claimed is:

1. A method for recording a memory parameter for a memory module having a non-volatile memory, the method for recording the memory parameter comprising the steps of:
    booting a computer system;
    changing parameter data of the memory module as an enhancement parameter data via a basic input output system (BIOS) set-up menu;
    writing the enhancement parameter data into a memory controller;
    testing the memory module according to the enhancement parameter data;
    writing the enhancement parameter data into an undefined memory block of the non-volatile memory when the memory module is tested to be stable write in the non-volatile memory of the memory module; and
    when the computer system or other computer systems boot next time, reading the enhancement parameter data from the undefined memory block of the non-volatile memory for setting the memory controller.

2. The method for recording the memory parameter according to claim 1, wherein after the step of changing the parameter data via the BIOS set-up menu, the method further comprises the steps of:
    storing the parameter data changed at the BIOS set-up menu; and
    rebooting the computer system.

3. The method for recording the memory parameter according to claim 2, wherein when the memory module is tested to be stable, the step of writing the enhancement parameter data into the undefined memory block of the non-volatile memory comprises the steps of:
    reading the enhancement parameter data from the memory controller; and
    writing the enhancement parameter data read from the memory controller into the undefined memory block of the non-volatile memory.

4. The method for recording the memory parameter according to claim 3 further comprising the step of:
    providing a portable memory parameter table in the undefined memory block of the non-volatile memory.

5. The method for recording the memory parameter according to claim 4, wherein the step of writing the enhancement parameter data read from the memory controller into the undefined memory block of the non-volatile memory comprises the steps of:
    converting the enhancement parameter data read from the memory controller to have a format conforming to the format of the portable memory parameter table; and
    writing the enhancement parameter data having the format conforming to the format of the portable memory parameter table into the portable memory parameter table of the undefined memory block of the non-volatile memory.

6. The method for recording the memory parameter according to claim 1, wherein the non-volatile memory is an electrically erasable programmable read only memory (EEPROM), and serial presence detect (SPD) data are stored in the EEPROM.

7. The method for recording the memory parameter according to claim 1, wherein the parameter data comprise the operation frequency, the column address strobe (CAS) latency, the row address strobe (RAS) precharge time, the RAS-to-CAS delay and the RAS activate to precharge time of the memory module.

8. The method for recording the memory parameter according to claim 1, wherein the memory module is a dynamic random access memory (DRAM).

9. A method for adjusting access parameters of a memory applied to a memory module having a non-volatile memory, the method for optimizing the memory comprising the steps of:
    changing parameter data of the memory module to allow an undefined memory block in the non-volatile memory in the memory module to store an enhancement parameter data;
    booting a computer system;
    reading data from the undefined memory block of non-volatile memory of the memory module;
    determining whether the enhancement parameter data are stored in the undefined memory block in the non-volatile memory; and
    writing the enhancement parameter data into a memory controller when the enhancement parameter data are stored in the undefined memory block of the memory module.

10. The method for adjusting the access parameters of the memory according to claim 9, wherein standard parameter data are stored in a defined memory block in the non-volatile memory, and the method further comprises the step of storing the standard parameter data after the step of reading the data from the non-volatile memory.

11. The method for adjusting the access parameters of the memory according to claim 10 further comprising the step of:
    providing a specific option in a BIOS, wherein the setting value of the specific option is used to record whether the enhancement parameter data are utilized.

12. The method for adjusting the access parameters of the memory according to claim 11, wherein when the enhancement parameter data are stored in the undefined memory block, the method comprises the steps of:
    determining whether to utilize the enhancement parameter data according to the setting value of the specific option;

writing the enhancement parameter data into the memory controller when the enhancement parameter data are utilized; and writing the standard parameter data into the memory controller when the enhancement parameter data are not utilized.

13. The method for adjusting the access parameters of the memory according to claim 9 further comprising the step of:

providing a portable memory parameter table in the undefined memory block of the non-volatile memory, wherein the portable memory parameter table stores a plurality of groups of portable parameter data.

14. The method for adjusting the access parameters of the memory according to claim 13, wherein the step of determining whether the enhancement parameter data are stored in the undefined memory block in the non-volatile memory comprises the step of:

determining whether the non-volatile memory stores the portable memory parameter table.

15. The method for adjusting the access parameters of the memory according to claim 14 further comprising the step of:

choosing a group of portable parameter data from the portable parameter data as the enhancement parameter data.

16. The method for adjusting the access parameters of the memory according to claim 9, wherein the non-volatile memory is an electrically erasable programmable read only memory (EEPROM), and serial presence detect (SPD) data are stored in the EEPROM.

17. The method for adjusting the access parameters of the memory according to claim 9, wherein the parameter data comprise the operation frequency, the column address strobe latency, the RAS-to-CAS delay, the RAS precharge time and the RAS activate to precharge time of the memory module.

18. The method for adjusting the access parameters of the memory according to claim 9, wherein the memory module is a dynamic random access memory (DRAM).

\* \* \* \* \*